United States Patent
Bautista et al.

(10) Patent No.: US 9,530,955 B2
(45) Date of Patent: Dec. 27, 2016

(54) ULTRASOUND TRANSDUCER AND PROCESSING METHODS THEREOF

(71) Applicant: ACIST MEDICAL SYSTEMS, INC., Eden Prairie, MN (US)

(72) Inventors: Richard Bautista, Palo Alto, CA (US); Robert Zelenka, Milipitas, CA (US)

(73) Assignee: ACIST MEDICAL SYSTEMS, INC., Eden Prairie, MN (US)

( * ) Notice: Subject to any disclaimer, the term of this patent is extended or adjusted under 35 U.S.C. 154(b) by 451 days.

(21) Appl. No.: 13/679,847

(22) Filed: Nov. 16, 2012

(65) Prior Publication Data

US 2013/0127297 A1    May 23, 2013

Related U.S. Application Data

(60) Provisional application No. 61/561,534, filed on Nov. 18, 2011.

(51) Int. Cl.
| | | |
|---|---|---|
| *H04R 31/00* | (2006.01) | |
| *H01L 41/08* | (2006.01) | |
| *B06B 1/06* | (2006.01) | |
| *H04R 1/02* | (2006.01) | |
| *H04R 1/10* | (2006.01) | |

(52) U.S. Cl.
CPC ........... *H01L 41/0805* (2013.01); *B06B 1/067* (2013.01); *H04R 1/1091* (2013.01); *H04R 31/00* (2013.01); *H04R 1/023* (2013.01); *H04R 1/1016* (2013.01); *Y10T 29/42* (2015.01)

(58) Field of Classification Search
CPC ....... B06B 1/0622; G10K 11/02; G10K 11/30; H04R 17/00
USPC .......................................... 310/322, 334, 335
See application file for complete search history.

(56) References Cited

U.S. PATENT DOCUMENTS

| | | | |
|---|---|---|---|
| 2,833,999 | A | 5/1958 | Howry |
| 5,065,068 | A | 11/1991 | Oakley et al. |
| 5,415,175 | A | 5/1995 | Hanafy et al. |
| 5,438,998 | A | 8/1995 | Hanafy |
| 5,678,554 | A | 10/1997 | Hossack et al. |
| 5,971,925 | A | 10/1999 | Hossack et al. |

(Continued)

FOREIGN PATENT DOCUMENTS

| | | |
|---|---|---|
| EP | 0620048 A3 | 11/1995 |
| EP | 0631272 B1 | 11/2001 |

(Continued)

OTHER PUBLICATIONS

Ballandras et al., "Periodic arrays of transducers built using sand blasting and ultrasound micromachining techniques for the fabrication of piezocomposite materials", 2001 IEEE Ultrasonics Symposium, pp. 871-874, 0/7803-7177-1/10, 2001 IEEE.

(Continued)

*Primary Examiner* — Derek Rosenau
*Assistant Examiner* — Bryan Gordon
(74) *Attorney, Agent, or Firm* — Fredrikson & Byron, P.A.

(57) ABSTRACT

An ultrasonic transducer includes a backing element, an active element overlying the backing layer, and a matching element overlying the active element, the matching element having an inner surface that contacts the active element and an outer surface with a non-homogeneous texture and/or material composition. The matching element may be formed by subtractive or deposition techniques.

20 Claims, 7 Drawing Sheets

(56) References Cited

U.S. PATENT DOCUMENTS

| | | | |
|---|---|---|---|
| 5,974,884 A * | 11/1999 | Sano | G01N 29/2462 73/588 |
| 5,984,871 A | 11/1999 | TenHoff et al. | |
| 6,036,648 A | 3/2000 | White et al. | |
| 6,225,729 B1 * | 5/2001 | Izumi | G10K 11/02 310/334 |
| 6,278,224 B1 | 8/2001 | Sawada et al. | |
| 6,310,426 B1 * | 10/2001 | Birchak | B06B 3/04 310/335 |
| 6,371,915 B1 * | 4/2002 | Koger et al. | 600/445 |
| 6,969,943 B2 | 11/2005 | Hashimoto et al. | |
| 7,075,215 B2 * | 7/2006 | Yogeswaren | G01V 1/52 310/334 |
| 7,199,509 B2 | 4/2007 | Kuniyasu et al. | |
| 7,830,069 B2 * | 11/2010 | Lukacs | B06B 1/0622 310/334 |
| 2001/0032511 A1 | 10/2001 | Nagai et al. | |
| 2003/0032884 A1 | 2/2003 | Smith et al. | |
| 2004/0113522 A1 * | 6/2004 | Nagahara | G10K 11/02 310/326 |
| 2004/0190377 A1 | 9/2004 | Lewandowski et al. | |
| 2005/0225211 A1 | 10/2005 | Oliver | |
| 2007/0182290 A1 | 8/2007 | Guo et al. | |
| 2007/0287920 A1 * | 12/2007 | Sawada | A61B 8/12 600/463 |
| 2008/0001504 A1 | 1/2008 | Cross et al. | |
| 2009/0064476 A1 | 3/2009 | Cross et al. | |
| 2009/0069691 A1 * | 3/2009 | Saito | B06B 1/0622 600/459 |
| 2011/0062824 A1 * | 3/2011 | Wada | B06B 1/0622 310/334 |
| 2013/0072802 A1 | 3/2013 | Hozumi | |
| 2013/0090561 A1 | 4/2013 | Kusukame et al. | |
| 2013/0127297 A1 | 5/2013 | Bautista et al. | |
| 2013/0200755 A1 | 8/2013 | Kim et al. | |

FOREIGN PATENT DOCUMENTS

| | | |
|---|---|---|
| EP | 1416255 A1 | 5/2004 |
| EP | 2405671 A1 | 1/2012 |
| EP | 2610860 A2 | 7/2013 |
| JP | 2004184423 A | 7/2004 |
| WO | 02052544 A2 | 7/2002 |
| WO | 2005104210 A2 | 11/2005 |
| WO | 2012144117 A1 | 10/2012 |
| WO | 2014077836 A1 | 5/2014 |

OTHER PUBLICATIONS

Comco, Inc., "Micro-Abrasive Blasting Solutions for Medical Products", 2 pages, Comco Inc., Burbank, California.

Safarevich et al., "Fiber Laser Welding of High Integrity Implantable Medical Devices", 8 pages, Crafford-LaserStar Technologies Corporation, Riverside, Rhode Island.

Notification of Transmittal of the International Search Report and the Written Opinion of the International Searching Authority, or the Declaration, May 13, 2013, 11 pages, Korean Intellectual Property Office, Daejeon, Republic of Korea.

Flat Lapping, 6 pages, WEC 04/04 Machining.

Performance Features and Benefits, LaserStar 990 Series iWeld Laser Welding Machine, 1 page, LaserStar Technologies Corporation, Riverside, Rhode Island.

Richter, Alan, Blast Off—Taking the 'black art' out of micro-abrasive blasting, Micro Manufacturing, Fall 2009, 5 pages, vol. 2, Issue 3, Rowley, Massachusetts.

Shaw et al., NASA Evaluation of ESD Effects During Removal of Conformal Coatings Using Micro Abrasive Blasting, Feb. 25, 2011, 13 pages, Crystal Mark, Inc., Glendale, California.

Tra-Con Tra-Duct 2902 Room Temperature Conductive Silver Epoxy Adhesive, 1 page, MatWeb.com, Tra-Con, Inc., Bedford, Massachusetts.

European Search Report dated Aug. 14, 2015 for EP12888489.7 filed Jun. 4, 2014.

* cited by examiner

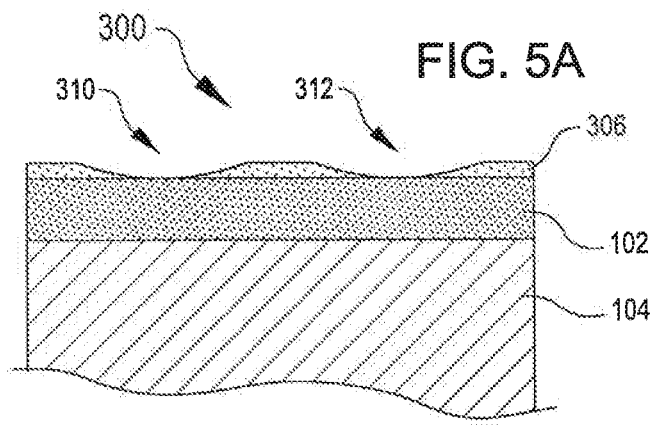
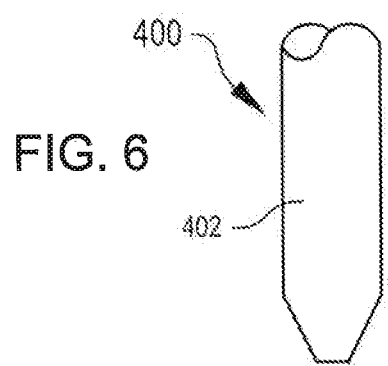
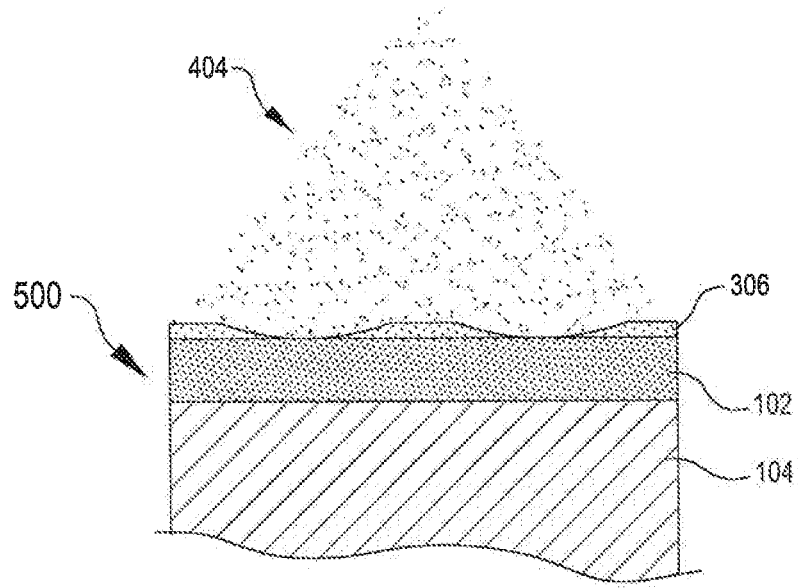

ULTRASOUND TRANSDUCER AND PROCESSING METHODS THEREOF

PRIORITY CLAIM

The present application claims the benefit of U.S. Provisional Patent Application Ser. No. 61/561,534, filed Nov. 18, 2011, which application is incorporated herein by reference in its entirety.

BACKGROUND

This application generally relates to ultrasonic transducers. The application further relates to ultrasonic transducers used for medical imaging.

A trade-off in medical ultrasound imaging is depth of penetration and spatial resolution. Higher ultrasound imaging frequencies enable higher spatial resolution at the expense of depth of penetration. Lower ultrasound imaging frequencies enable deeper penetration at the expense of spatial resolution. It would be useful if a single ultrasound imaging device was able to image across a broad range of frequencies in order to operate at a higher frequency for better spatial resolution and at a lower frequency for deeper penetration.

Broad bandwidth ultrasound imaging devices may include use of high sensitivity materials (e.g., single crystal piezoelectric composites), use of multiple matching layers, use of multiple transducers, and use of multiple devices. These approaches can be expensive and be difficult to implement from a manufacturing perspective, particularly for small, single-use, high-frequency ultrasound devices that are used in relatively high volumes (e.g., intravascular ultrasound catheters).

It would be advantageous to have an ultrasound transducer structure and corresponding manufacturing process that enables broadband imaging performance for small, single-use, high-frequency ultrasound devices. It would be further advantageous if the transducer is cost effective and easy to manufacture.

SUMMARY

In one embodiment, an ultrasonic transducer includes a backing element, an active element overlying the backing element, and a matching element overlying the active element. The matching element having an inner surface that contacts the active element and an outer surface with a non-homogenous texture and/or material composition.

The matching element may be a single matching layer where the outer surface has a first region with a first texture and a first material composition and a second region with a second texture and a second material composition. The first texture differs from the second texture and/or the first material composition differs from the second material composition.

The first and second textures of the matching layer may be coarse or rough. The first and second regions may have a reduced thickness in the matching layer. The first and second textures may be formed by ablation. The first and second textures may be formed by abrasion.

Alternatively, the matching element may include a plurality of matching regions having different thicknesses. The matching regions may be arranged side-by-side on the active element. At least two of the matching regions may be overlapping.

Furthermore, the matching layer may include a plurality of discrete matching regions of a first material over the active element. The matching element may further include a fill-in matching region of a second material with a different composition from the first material deposited between the discrete matching regions over the active element. The discrete matching regions of the first material and the discrete matching regions of the second material may be of the same thickness thereby forming a matching layer formed from two materials with different compositions.

In a further embodiment, a method of making an ultrasonic transducer includes the steps of providing a backing element, providing an active element overlying the backing layer, and forming a matching element over the active element, the matching element having an inner surface that contacts the active element and an outer surface with a non-homogeneous texture and/or material composition.

The matching element may be a single matching layer and the forming step may include providing the outer surface with a first region having a first texture and a first material composition and a second region having a second texture and a second material composition. The first texture differs from the second texture and/or the first material composition differs from the second material composition.

The matching layer has a thickness, and the step of providing the outers surface with first and second regions includes a step of reducing the thickness of the matching layer. The reducing step may include ablation. The reducing step may include abrasion.

The forming step may include providing the matching layer with a plurality of matching regions. The step of providing the matching layer with a plurality of matching regions may include arranging the matching regions side-by-side on the active element. The step of providing the matching layer with a plurality of matching regions may include overlapping at least two of the matching regions.

The forming step may include depositing a plurality of discrete matching regions of a first material on the active element. The forming step may further include forming a fill-in matching region of a second element between the discrete matching regions of the first material deposited on the active element. The method may further include the further step of causing the discrete matching regions of the first material and the discrete matching regions of the second material to have the same thickness.

BRIEF DESCRIPTION OF THE DRAWINGS

The following drawings illustrate some particular embodiments of the present invention and therefore do not limit the scope of the invention. The drawings are not to scale (unless so stated) and are intended for use in conjunction with the explanations in the following detailed description. Some embodiments will hereinafter be described in conjunction with the appended drawings, wherein like numerals denote like elements.

FIG. 5A is a section view of the transducer stack shown in FIG. 5.

FIG. 6 illustrates micro-abrasive blasting of a matching element of a transducer stack in accordance with an embodiment.

DETAILED DESCRIPTION OF THE PREFERRED EMBODIMENTS

The following detailed description is exemplary in nature and is not intended to limit the scope, applicability, or configuration of the invention in any way. Rather, the following description provides some practical illustrations for implementing some embodiments of the present invention. Examples of constructions, materials, dimensions, and manufacturing processes are provided for selected elements, and all other elements employ that which is known to those of ordinary skill in the field of the invention. Those skilled in the art will recognize that many of the noted examples have a variety of suitable alternatives.

For example, this application provide certain examples of a transducer stack appropriate for use in an intravascular ultrasound (IVUS) catheter having an ultrasound transducer disposed within the catheter sheath. These examples are given for illustrative purposes only and do not limit the application of the invention to only IVUS catheters.

Figure 1:
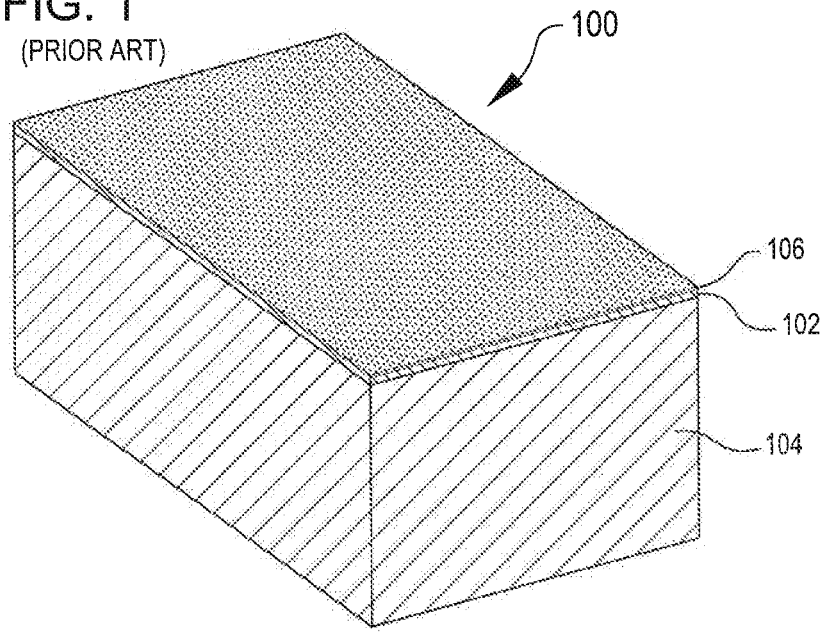
FIG. 1 is a perspective view of a prior art transducer stack in accordance with an embodiment.

FIG. 1 illustrates a prior art ultrasound transducer stack 100 having a backing layer 104, an active element 101 that includes a single active layer 102, and a matching element 105 that includes a single matching layer 106. Transducer stack 100 is illustrated as having rectangular shape. In other examples, the transducer stack 100 may have other shapes, including square, circle, and oval. Transducer stack 100 may also include at least one electrode layer (not shown), which may be formed from metal, including gold and chrome. In one example, the transducer stack 100 may include two electrode layers located on the top and bottom surfaces of active element 101, respectively. The electrode layer generally facilitates electrical excitation of the active layer. Transducer stack 100 may be electrically connected to a signal generator (not shown) to electrically excite the transducer stack. Transducer stack 100 may also be electrically connected to a receiver (not shown) to detect pressure fields that are converted to electrical signals by the transducer stack.

FIG. 1 shows active element 101 which includes active layer 102. Active layer 102 may also be referred to as a piezoelectric layer. In other examples, active element 101 may include multiple active layers. Active layer 102 may be composed of a ceramic material such as lead zirconate titanate, commonly known as PZT. The thickness of active layer 102 determines the thickness resonance of the layer. For example, a 36 µm Motorola 3203HD material has a thickness resonance of approximately 63 MHz. Alternatively, active layer 102 may be composed of a composite material such as lead magnesium niobate-lead titanate single crystal, commonly known as PMN-PT and polymer, wherein a resonance is determined by a longitudinal length mode rather than a thickness mode.

Backing layer 104 may be composed of an electrically conductive epoxy, such as a tungsten-loaded epoxy. In the example of a transducer stack for use in an IVUS catheter, the thickness of backing layer 104 may be 200 µm or greater. In other examples, the appropriate thickness of backing layer 104 should be sufficiently thick to attenuate ultrasonic vibrations from active element 101 in the backwards direction (toward backing layer).

FIG. 1 also illustrates matching element 105 which includes matching layer 106. Matching layer 106 may be composed of an electrically conductive epoxy, such as a silver-loaded epoxy. Matching layer 106 provides a better acoustic impedance match between active element 101 and the medium in which transducer stack 100 is located. Matching layer 106 may have a uniform thickness that is equal to one quarter of the wavelength at the nominal center frequency of transducer stack 100 and is commonly referred to as a quarter-wave matching layer. Matching element 105 improves the efficiency of the transducer stack to transmit ultrasound vibrations into the surrounding medium and to receive ultrasound vibrations from the surrounding medium. While transducer stack 100 is shown for illustrative purposes in FIG. 1 to have matching element 105 having only one matching layer 106, in other examples, matching element 105 may have more than one matching layer to further improve efficiency.

Figure 2:
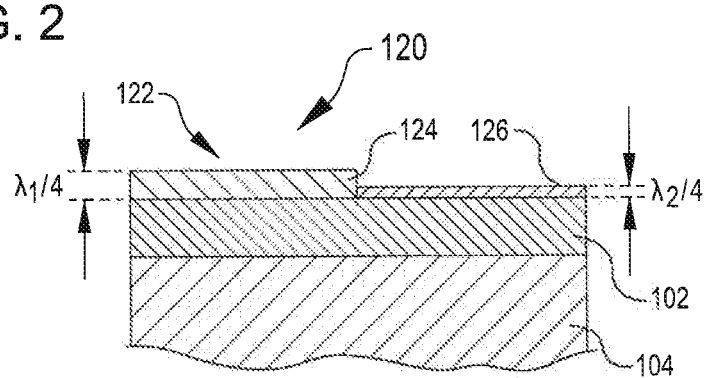
FIG. 2 is a section view of a transducer stack with a matching element having two matching regions in accordance with an embodiment.
Figure 3:
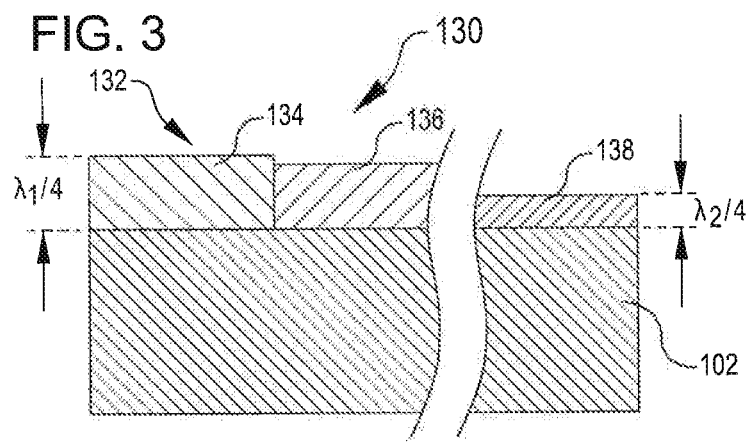
FIG. 3 is a section view of a transducer stack with a matching element having more than two matching regions in accordance with an embodiment.

FIGS. 2 and 3 are section views of transducer stacks that illustrate matching elements having side-by-side matching regions. FIG. 2 shows transducer stack 120 which includes backing layer 104, active element 101 including active layer 102, and matching element 122. Matching element 122 includes a quarter-wave matching region 124 tuned to a first wavelength $\lambda_1$ with a thickness equal to $\lambda_1/4$. Matching element 122 also includes a quarter-wave matching region 126 tuned to a second wavelength $\lambda_2$ with a thickness equal to $\lambda_2/4$. Matching regions 124, 126 may be formed from the same material, such as a silver-loaded epoxy. In other examples, matching regions 124, 126 may be formed from materials with different composition. For example, matching region 124 may be formed from a silver-loaded epoxy having a first volume concentration of silver, while matching region 126 may be formed from a silver-loaded epoxy having a second volume concentration of silver. The volume concentration of silver may affect mass density and speed of sound of matching element 122 which in turn affect the corresponding wavelength at a given ultrasound frequency. The first and second regions of matching regions 124, 126 may then exhibit different corresponding quarter wavelengths. The volume concentration of silver may also affect acoustic impedance of matching element 122. Matching regions 124, 126 may exhibit different efficiencies at different ultrasound frequencies to transmit ultrasound vibrations into the surrounding medium and to receive ultrasound vibrations from the surrounding medium.

FIG. 3 illustrates transducer stack 130 having matching element 132 which includes a plurality of matching regions 134-138. As can be appreciated, matching regions 134-138 of matching element 132 may be formed from the same material or different materials. Matching regions 134-138 of the matching element 132 may then exhibit different corresponding quarter wavelengths. The portions of transducer stack 130 having matching regions 134-138 of matching element 132 may exhibit different efficiencies at different ultrasound frequencies to transmit ultrasound vibrations into the surrounding medium and to receive ultrasound vibrations from the surrounding medium.

This application discloses a transducer stack having a matching layer that is matched at more than one ultrasound frequency to improve the transmit and receive efficiency of the transducer stack for a broader range of ultrasound frequencies. There are a number of techniques that may be used to form a matching element that is matched at more than one ultrasound frequency. Subtractive techniques like machining, grinding or etching may be used to modify the thickness profile of a matching layer in a matching element. Other subtractive techniques such as laser ablation or micro-abrasive blasting modify the thickness of the matching element and may also modify the composition profile of the matching element. For example, when a matching layer formed from silver-loaded epoxy is laser ablated or abrasively blasted, more of the softer epoxy may be removed compared to the silver. This would change the mass density of the ablated/blasted regions which may have an effect on the ultrasonic properties of the matching element. Generally, subtractive techniques will also increase the effective surface area of the matching element which can impact on the ultrasonic properties of the matching element.

These subtractive techniques may be used individually, or in combination to form a matching element with a coarse or roughened surface. The coarse or roughened surface of the matching element creates a varying and non-uniform thickness allowing the matching element to match to more than one ultrasound frequency. Furthermore, the coarse or roughened surface of the matching element results in an increased effective surface area of the matching element, can impact the ultrasonic properties of the matching element. Precise control of the matching element modification process will provide further improvements. An ultrasound transducer stack having a matching element with finely controlled, coarseness or roughness enables balancing the amount of transducer area matched to different ultrasound frequencies.

Figure 4:
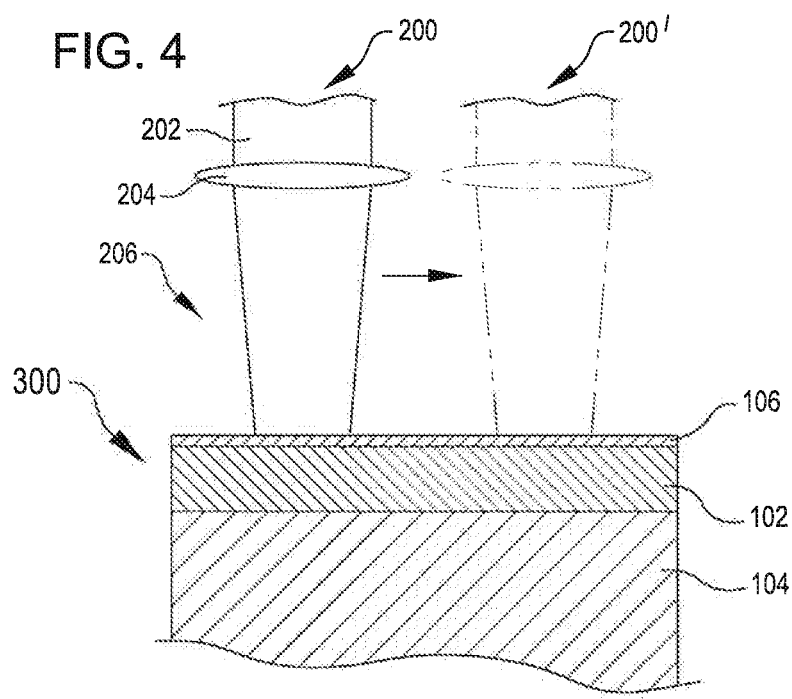
FIG. 4 illustrates laser ablation of a matching element of a transducer stack in accordance with an embodiment.

One example of a subtractive technique that may be used to form a matching element able to match at more than one ultrasound frequency is laser ablation. FIG. 4 illustrates a laser system 200 ablating a surface of matching element 105 of transducer stack 300. Laser system 200 includes a light source (not shown) that may operate in the near-infrared spectrum wherein the optical wavelength can vary between 800 nm and 2500 nm. Exemplary laser sources that operate in the near-infrared spectrum include neodymium-doped yttrium aluminum garnet (or ND:YAG) lasers, laser diodes, and fiber lasers. The light source generates laser beam 202 that may be directed through lens 204. Focused laser beam 206 ablates a surface of matching element 105 to form an ablated region (see FIG. 5). Laser system 200 may be repeatedly translated to ablate multiple regions of a surface of matching element 105. Alternatively, transducer stack 300 may be translated relative to the laser system 200. The ablated region size and depth for a given laser system may be controlled by the laser system pulse energy, pulse duration and laser beam diameter.

Figure 5:
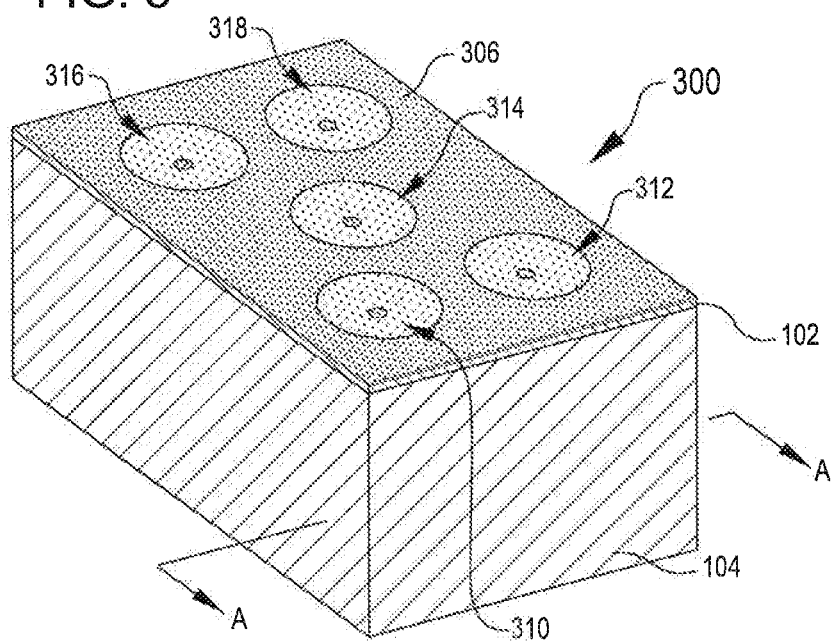
FIG. 5 is a perspective view of a transducer stack with a laser-ablated matching element in accordance with an embodiment.

FIG. 5 illustrates transducer stack 300 having matching element 105 including matching layer 306. Matching element 105 is shown to have five (5) ablated regions 310-318. FIG. 5A shows a section view of transducer stack 300 including ablated regions 310, 312. In the example of a transducer stack for use in an IVUS catheter, the number of ablated regions may range from one (1) to 40, wherein the diameter of the ablated regions may range from 50 µm to 500 µm. The ablated regions may be distributed uniformly or unevenly across the face of the matching layer. In other examples, the appropriate size, number and location of laser-ablated regions on the matching element may vary depending on the specific application of the transducer stack.

Another example of a subtractive technique that may be used to form a matching element able to match at more than one ultrasound frequency is micro-abrasive blasting. FIG. 6 illustrates micro-abrasive blasting system 400 that is ablating matching element 305. Micro-abrasive blasting system 400 includes abrasive nozzle 402. Micro-abrasive blasting system 400 delivers a stream of abrasive particles 404 to matching element 305 of transducer stack 500 typically using a pressurized gas such as nitrogen or dry air. In the example of a transducer stack for use in an IVUS catheter, the size of the abrasive particles may range from 10 µm to 200 µm and include soft abrasives such as wheat starch or sodium bicarbonate; the depths of the ablated regions generally range between 0.1 µm and 10 µm; the pressure of the pressurized gas may range between 40 PSI and 140 PSI; and the area of the abrasive-blasted region is generally the entire surface area of the matching element. In other examples, the appropriate size and hardness of the abrasive particles, depth of ablated regions, pressure of the pressurized gas, and area of abrasive blasting may vary depending on the specific application of the transducer stack.

Figure 7:
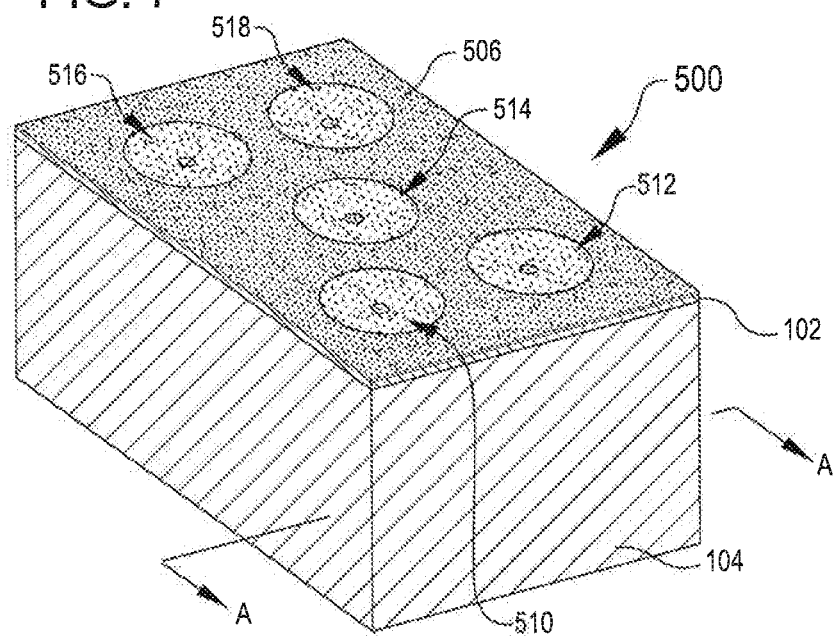
FIG. 7 is a perspective view of a transducer stack with a laser-ablated and micro-abrasive blasted matching element in accordance with an embodiment.
Figure 7A:
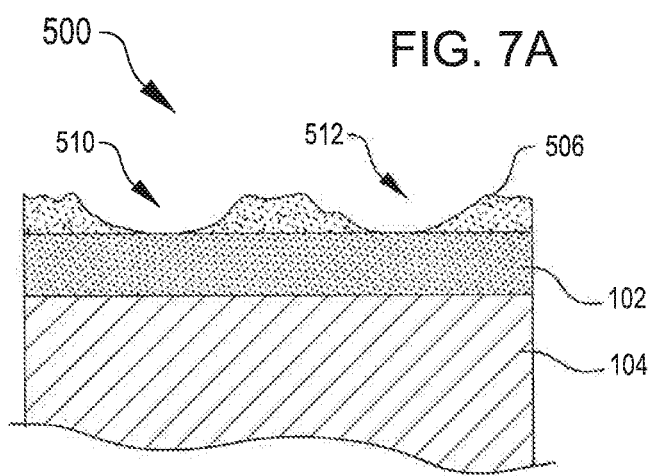
FIG. 7A is a section view of the transducer stack shown in FIG. 7.

Subtractive techniques may be used in combination to further increase the transmit and receive efficiency of a transducer stack over a broader range of frequencies. FIG. 7 illustrates transducer stack 500 having an abrasive-blasted and a laser-ablated matching element 505. The surface of matching element 505 is shown to have laser-ablated regions 510-518. FIG. 7A shows a section view of transducer stack 500 that includes ablated regions 510, 512 that have been laser-ablated and abrasive-blasted.

Figure 8:
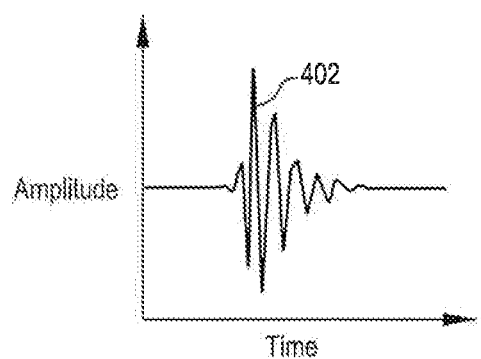
FIG. 8 illustrates a time-domain response of an ultrasonic transducer stack before ablation in accordance with an embodiment.
Figure 9:
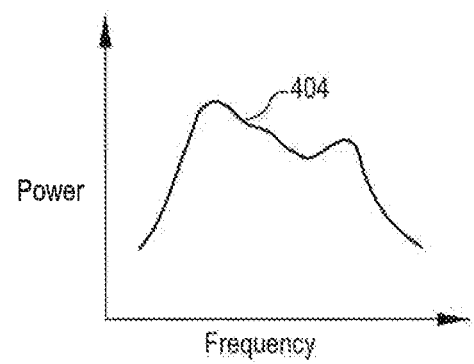
FIG. 9 illustrates a frequency-domain response of a transducer stack before ablation in accordance with an embodiment.
Figure 10:
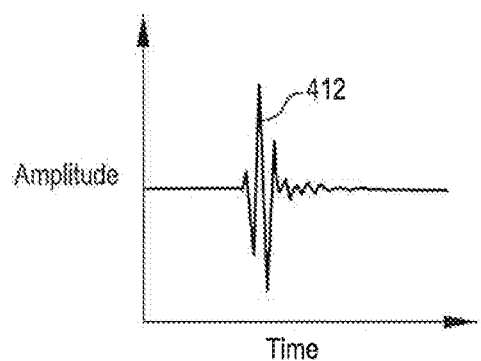
FIG. 10 illustrates a time-domain response of a transducer stack after ablation in accordance with an embodiment.
Figure 11:
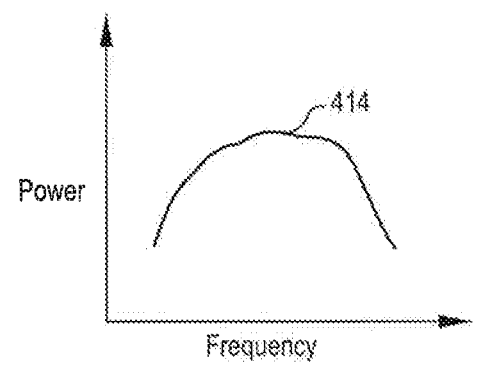
FIG. 11 illustrates a frequency-domain response of a transducer stack after ablation in accordance with an embodiment.

FIGS. 8 to 11 illustrate the effect of matching layer ablation on pulse-echo time-domain and frequency-domain responses of an ultrasonic transducer stack to a short-time electrical excitation. Measurement of the pulse-echo time-domain and frequency-domain responses of an ultrasonic transducer stack are known to those skilled in the art of ultrasound imaging. FIG. 8 shows a time-domain pulse-echo response 402 of the transducer stack 300 before ablation of the matching layer 106, as illustrated in FIG. 4. FIG. 9 shows a pulse-echo (frequency-domain) power spectrum 404 that corresponds to the time-domain pulse-echo response 402 of the transducer stack 300 before ablation of a matching layer 106. FIG. 10 shows a time-domain pulse-echo response 412 of the transducer stack 500 after laser ablation and abrasive blasting of the matching layer 506, as illustrated in FIG. 7A. FIG. 11 shows a pulse-echo (frequency-domain) power spectrum 414 that corresponds to the time-domain pulse-echo response 412 of the transducer stack 500 after laser ablation and abrasive blasting of the matching layer 506. The effects of matching element ablation on pulse-echo time-domain and frequency-domain responses of the ultrasonic transducer stack are decreased time-domain pulse length, increased center frequency, and increased bandwidth. These effects generally provide improved image quality of ultrasound devices.

Figure 12:
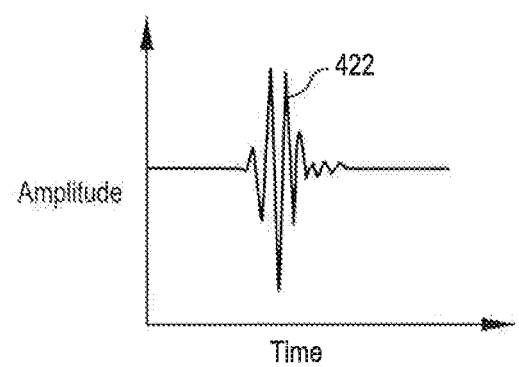
FIG. 12 illustrates a time-domain response of a transducer stack after ablation that is excited at a first frequency in accordance with an embodiment.
Figure 13:
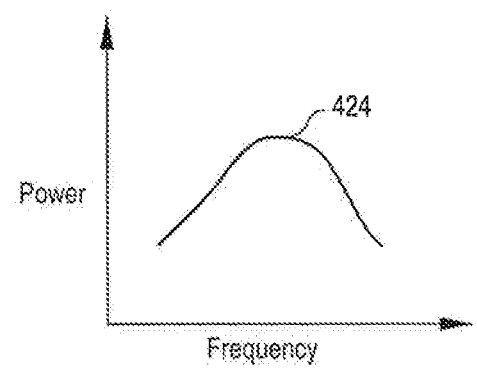
FIG. 13 illustrates a frequency-domain response of a transducer stack after ablation that is excited at a first frequency in accordance with an embodiment.
Figure 14:
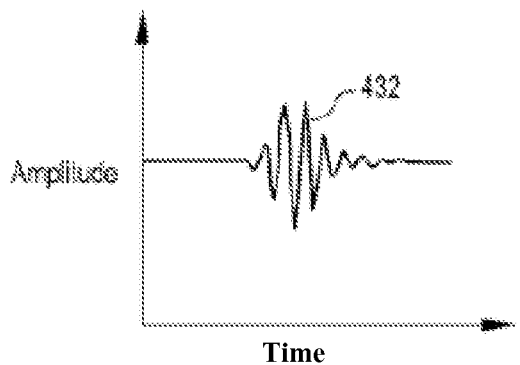
FIG. 14 illustrates a time-domain response of a transducer stack after ablation that is excited at a second frequency in accordance with an embodiment.
Figure 15:
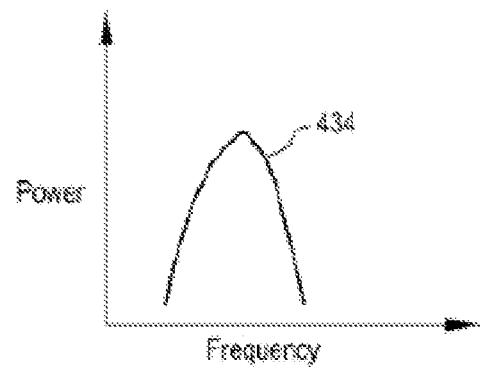
FIG. 15 illustrates a frequency-domain response of a transducer stack after ablation that is excited at a second frequency in accordance with an embodiment.

The increased bandwidth further enables imaging at more than one frequency. FIGS. 12 to 15 show the pulse-echo time-domain and frequency-domain responses of transducer stack 500 having an ablated matching element 505, as illustrated in FIG. 7. FIGS. 12 and 13 respectively show a pulse-echo time-domain response 422 and a pulse-echo (frequency-domain) power spectrum 424 of a short-time electrical excitation having a first frequency. FIGS. 14 and 15 respectively show a pulse-echo time-domain response 432 and a pulse-echo (frequency-domain) power spectrum 434 of a short-time electrical excitation having a second frequency, wherein the second frequency is lower than the first frequency. The pulse-echo time-domain response 422 of the transducer to the first-frequency, short-time, electrical excitation is shorter than the pulse-echo time-domain response 432 of the transducer to the second-frequency, short-time, electrical excitation. The pulse-echo power spectrum 424 of the transducer to the first-frequency, short-time, electrical excitation has a higher center frequency than that of the pulse-echo power spectrum 434 of the transducer to the second-frequency, short-time, electrical excitation. A transducer operating with a shorter time-domain pulse and higher center frequency will generally enable imaging with better spatial resolution and a smaller depth of penetration. Conversely, a transducer operating with a longer time-domain pulse and lower center frequency will generally enable imaging with a larger depth of penetration and lower spatial resolution.

Deposition techniques may also be used to increase the transmit and receive efficiency of a transducer stack over a broader range of frequencies. In one technique, one or more stencils may be used to form a matching layer of a matching element, the matching layer having multiple matching regions formed from materials with different compositions. Stencils can be developed from metals, such as stainless steel. Stencil patterns can be fabricated using known processes, such as photochemical machining. A stencil includes at least one cut-out hole that may be of a variety of shapes, including circle, rectangle, or triangle. In the example of a transducer stack for use in an IVUS catheter having a width of approximately 0.5 mm and a length of approximately 0.75 mm, the thickness of the stencil may range from 0.05 mm to 1 mm, and the cut-out holes may vary in size from approximately 0.025 mm to 0.5 mm. In other examples, the dimensions of the stencil and the size and shape of the cut-out holes may vary depending on the specific application of the transducer stack.

Figure 16:
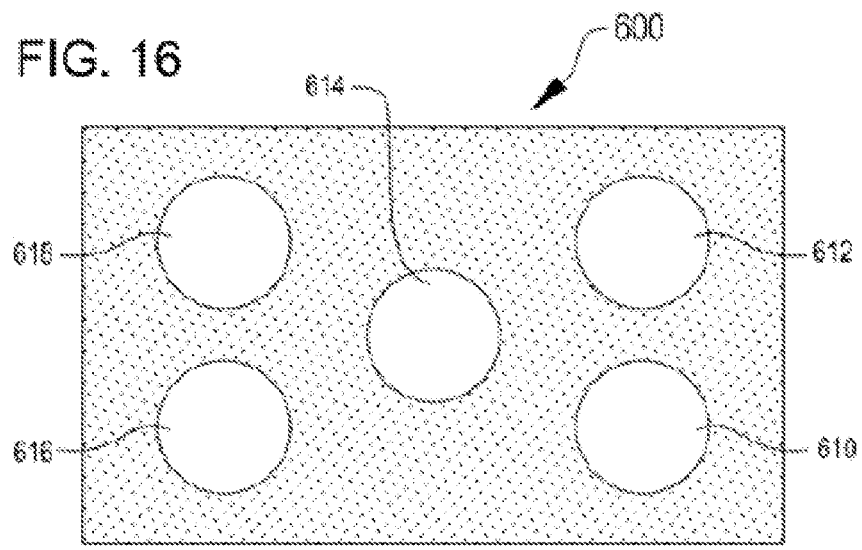
FIG. 16 is a top view of a matching element stencil in accordance with an embodiment.

FIG. 16 illustrates a top view of an example of a stencil 600 that may be used to deposit a first material on a transducer stack that may be used in an IVUS catheter. The stencil length is approximately 0.75 mm, width is approximately 0.5 mm, and thickness is approximately 0.05 mm. The stencil 600 includes five (5) cut-out holes 610-618 wherein the cut-holes are circular in shape and have diameters of approximately 0.15 mm.

Figure 17:
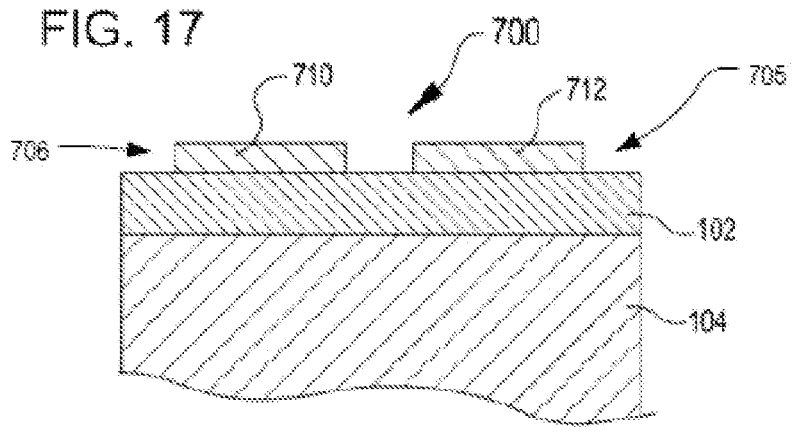
FIG. 17 is a section view of a transducer stack having matching regions formed from a first material based on the stencil shown in FIG. 16.

FIG. 17 shows a section view of transducer stack 700 including matching element 705 having partial matching layer 706. Partial matching layer 706 includes matching regions 710, 712 formed from a first material. Matching regions 710, 712 are formed by aligning stencil 600, shown in FIG. 16, with the top surface of transducer stack 700. The first material, such as an epoxy containing a first volume fraction of silver, is then applied to transducer stack 700. Excess first material may be removed by scraping the top surface of stencil 600 using a razor blade or other sharp-bladed instrument after the first material is applied. Stencil 600 may then be removed from the top surface of transducer stack 700 thereby forming matching regions 710, 712 formed from the first material. Matching regions 710, 712 may then be permitted to cure before depositing additional materials.

Figure 18:
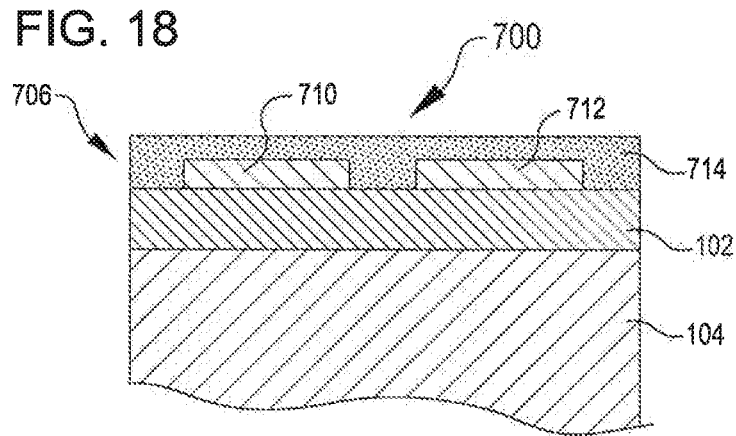
FIG. 18 is a section view of a transducer stack having a second material formed over matching regions formed from a first material based on the stencil shown in FIG. 16.
Figure 19:
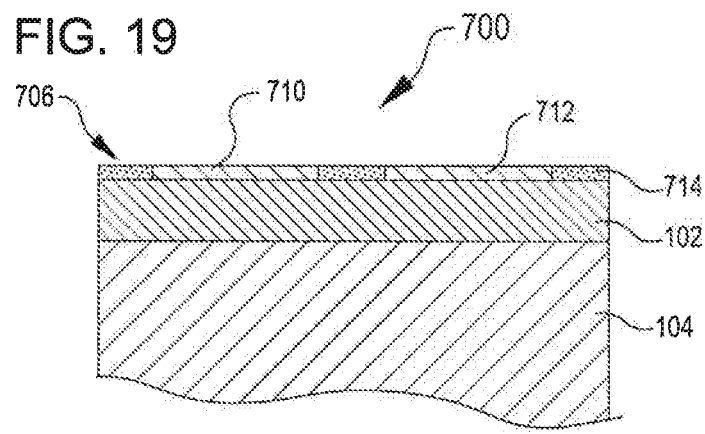
FIG. 19 is a section view of a transducer stack having matching regions formed from a first material and a matching region formed from a second material based on the stencil shown in FIG. 16.

FIG. 18 shows a section view of transducer stack 700 after having a second material 714, having a different composition from the first material, deposited on the top face of transducer stack 700 that include matching regions 710, 712 formed from the first material. The second material 714 may then be permitted to cure before applying a subtractive technique to reduce the thickness of matching layer 706 to a target thickness. The thickness of matching layer 706 can be reduced by a variety of techniques, for example machining. FIG. 19 shows a section view of the transducer stack 700 having a matching element 705 with a matching layer 706, the matching layer 706 including matching regions 710, 712 formed from the first material and matching region 714 formed from the second material. It can be appreciated that in other examples, a matching element may include a matching layer formed from more than two materials, each material having a different composition.

This application discloses a number of subtractive and deposition techniques, each method may be used individually to increase the transmit and receive efficiency of a transducer stack over a broad range of frequencies. It can be appreciated, that any of these methods may also be used in combination with each other to further increase the efficiency of a transducer stack. For example, as noted above, FIG. 7 shows a transducer stack 500 having a matching element having been both laser-ablated and abrasive-blasted. In another example, the transducer stack 700, as shown in FIG. 19, may have its matching element 705 coarsened or roughened using either laser ablation, abrasive blasting, or both. In yet another example, these techniques may be performed on transducer stack 120 and 130 as shown in FIGS. 2 and 3, respectively.

Furthermore, the subtractive and deposition techniques disclosed in this application may be used individually or in combination on varying transducer stacks. For example, these techniques may be performed on transducer stack 100 shown in FIG. 1 which includes backing layer 104, active element 101 having a single active layer 102, and matching element 105 having a single matching layer 106. In another example, these techniques may be performed on a transducer stack including a backing layer, an active element having one or more active layers, and a matching element having one or more matching layers. In yet another example, using FIG. 19 as a reference, these techniques may be applied to a transducer stack 700 having an active element 101 with more than one active layer, and a matching element 705 with more than one matching layer, where one of those layers is similar to matching layer 706.

In some embodiments, an ultrasonic transducer is provided. The transducer can include an active element having a first side and a second side. The transducer can include a backing element attached to the first side of the active element. The transducer can include a matching element attached to the second side of the active element. The matching element may have a surface that is coarse or roughened causing the matching element to have a non-uniform thickness.

Such an ultrasonic transducer can include a variety of characteristics. In some embodiments, the coarse or roughened surface of the matching element may include a plurality of concavities. In such embodiments, the concavities may be ablated regions. In some embodiments, the ablated regions may have diameters ranging between 50 µm and 500 µm. In some embodiments, by use of micro-abrasive blasting, the ablated regions may cover up to the entire surface of the transducer. In some embodiments, the matching element may include at least two matching layers. In some embodiments, the active element may further comprise two active layers.

In some embodiments, an ultrasonic transducer is provided. The transducer can include an active element having a first side and a second side. The transducer can include a backing element attached to the first side of the active element. The transducer can further include a matching element attached to the second side of the active element. The matching element may include at least one matching layer. At least one of the matching layers may include at least a first matching region formed from a first material and a second matching region formed from a second material. The first and the second materials can be formed from materials having different compositions.

Such an ultrasonic transducer can include a variety of characteristics. In some embodiments, a surface of the matching element may be coarse or roughened. In such embodiments, the matching element may have a non-uniform thickness. In some embodiments, the coarse or rough surface may include a plurality of concavities. In such embodiments, the concavities may be ablated regions. In some embodiments, the ablated regions may have diameters ranging between 50 µm and 500 µm. In some embodiments, by use of micro-abrasive blasting, the ablated regions may cover up to the entire surface of the transducer. In some embodiments, the matching element may include at least two matching layers. In some embodiments, the active layer may include at least two active layers.

Some embodiments provide a method of manufacturing an ultrasonic transducer. Some embodiments involve providing an active element having a first side and a second side. Some embodiments involve providing a backing element on the first side of the active element. Some embodiments involve forming a matching element on the second side of the active element. Some embodiments include forming a surface of the matching element such that the surface is coarse or roughened. In such embodiments, the matching element has a non-uniform thickness.

Such a method to form an ultrasonic transducer can include a variety of steps. In some embodiments, at least one subtractive technique may be used to form the matching element. In some embodiments, the at least one subtractive technique may include laser ablation. In some embodiments, the at least one subtractive technique may include micro-abrasive blasting. In some embodiments, the at least one subtractive technique may include both laser ablation and micro-abrasive blasting. In some embodiments, the at least one subtractive technique may include machining, grinding, or etching. In some embodiments, forming the active element may include forming at least two active layers. In some embodiments, forming the matching element may include forming at least two matching layers.

In some embodiments, a method of manufacturing an ultrasonic transducer. Some embodiments involve providing an active element having a first side and a second side. Some embodiments involve providing a backing element on the first side of the active element. Some embodiments involve forming a matching element on the second side of the active element. In such embodiments, the matching element may include a first matching layer. In such embodiments, the first matching layer may include a first matching region formed from a first material, and a second matching region formed from a second material having a different composition than the first material.

Such a method to form an ultrasonic transducer can include a variety of steps. In some embodiments, a first deposition technique may be used in forming the first matching layer. In such embodiments, the first deposition technique may include aligning a first stencil adjacent to the second side of the active element. In such embodiments, the stencil may have at least one cut-out-hole. In some embodiments, a first material may be applied to the first stencil. In some embodiments, the first stencil is removed and the first material is allowed to cure. In such embodiments, the cured first material forms the first matching region. In some embodiments, the first deposition technique may be repeated for a second stencil. In some embodiments, a second deposition technique may be used in forming the first matching layer. In such embodiments, the second deposition technique may include applying a second material to a surface of the matching element and allowing the second material to cure. In such embodiments, the cured second material forms the second matching region. In some embodiments, a first subtractive technique is used in forming the first matching layer. In such embodiments, the first subtractive technique may include reducing the thickness of the first matching layer until the thickness of the first and second matching regions are equal. In some embodiments, the first subtractive technique may include machining, grinding, or etching. In some embodiments, a second subtractive technique is used to form the matching element. In such embodiments, the matching element may have a surface that is coarse or rough. In such embodiments, the matching element may have a non-uniform thickness. In some embodiments, the second subtractive technique may include laser ablation. In some embodiments, the second subtractive technique may include micro-abrasive blasting. In some embodiments, the second subtractive technique may include both laser ablation and micro-abrasive blasting.

Thus, embodiments of the invention are disclosed. Although the present invention has been described in considerable detail with reference to certain disclosed embodiments, the disclosed embodiments are presented for purposes of illustration and not limitation and other embodiments of the invention are possible. One skilled in the art will appreciate that various changes, adaptations, and modifications may be made without departing from the spirit of the invention and the scope of the appended claims.

What is claimed is:

1. An ultrasonic transducer comprising:
a backing layer;
an active element overlying the backing layer; and
a matching element overlying the active element, the matching element having an inner surface that contacts the active element and an outer surface with a non-homogeneous texture, wherein the matching element comprises a single matching layer, the outer surface having a first region with a first texture and a second region with a second texture, the first texture differing from the second texture, and wherein the outer surface is opposite the inner surface.

2. The transducer of claim 1, wherein the outer surface has the first region with a first material composition and the second region with a second material composition, wherein the first material composition differs from the second material composition.

3. The transducer of claim 1, wherein the first and second textures are coarse or rough, the first and second regions having a reduced thickness in the matching layer.

4. The transducer of claim 3, wherein the first and second textures are formed by ablation.

5. The transducer of claim 3, wherein the first and second textures are formed by abrasion.

6. The transducer of claim 1, wherein the matching element includes a third matching region, the first, second, and third matching regions each having different thicknesses.

7. The transducer of claim 6, wherein the matching regions are arranged side-by-side on the active element.

8. The transducer of claim 2, wherein the matching element further includes a third matching region of the first material composition over the active element.

9. The transducer of claim 8, wherein the second matching region is a fill-in matching region of the second material composition deposited between the first and third matching regions of the first material over the active element.

10. The transducer of claim 9, wherein the matching regions of the first material and the matching regions of the second material are of the same thickness thereby forming a matching layer formed from two materials with different compositions.

11. A method of making an ultrasonic transducer comprising:
providing a backing layer;
providing an active element overlying the backing layer; and
forming a matching element over the active element, the matching element having an inner surface that contacts the active element and an outer surface with a non-homogeneous texture, wherein the matching element comprises a single matching layer, the outer surface having a first region with a first texture and a second region with a second texture, the first texture differing from the second texture, and wherein the outer surface is opposite the inner surface.

12. The method of claim 11, wherein the forming step includes providing the outer surface with the first region having a first material composition and the second region having a second material composition, wherein the first material composition differs from the second material composition.

13. The method of claim 11, wherein the matching layer has a thickness, and wherein the step of providing the outer surface with first and second regions includes a step of reducing the thickness of the matching layer.

14. The method of claim 13, wherein the reducing step includes ablation.

15. The method of claim 13, wherein the reducing step includes abrasion.

16. The method of claim 12, wherein the forming step includes providing the first and second matching regions with different thicknesses.

17. The method of claim 16, wherein the step of providing the first and second matching regions with different thicknesses includes arranging the first and second matching regions side-by side on the active element.

18. The method of claim 12, wherein the step of forming the matching element includes depositing a third matching region of the first material composition on the active element.

19. The method of claim 18, wherein the forming step further includes forming the second matching region to be a fill-in matching region of the second material composition between the first and third matching regions of the first material composition deposited on the active element.

20. The method of claim 19, further including a step of causing the matching regions of the first material composition and the matching region of the second material composition to have the same thickness.

* * * * *